(12) United States Patent
Kim et al.

(10) Patent No.: US 7,022,557 B2
(45) Date of Patent: Apr. 4, 2006

(54) THIN FILM TRANSISTOR ARRAY SUBSTRATE AND MANUFACTURING METHOD THEREOF

(75) Inventors: Woong Kwon Kim, Kunpo-shi (KR); Heung Lyul Cho, Suwon-shi (KR); Seung Hee Nam, Anyang-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/951,758

(22) Filed: Sep. 29, 2004

(65) Prior Publication Data

US 2005/0046762 A1    Mar. 3, 2005

Related U.S. Application Data

(62) Division of application No. 10/273,891, filed on Oct. 21, 2002, now Pat. No. 6,818,923.

(30) Foreign Application Priority Data

Apr. 17, 2002   (KR) .............................. 2002-21054

(51) Int. Cl.
    *H01L 21/84* (2006.01)
(52) U.S. Cl. .................. 438/149; 438/152; 438/155
(58) Field of Classification Search ........ 438/149–166; 257/66, 72; 349/46
    See application file for complete search history.

(56) References Cited

U.S. PATENT DOCUMENTS

| | | | | |
|---|---|---|---|---|
| 4,778,560 A * | 10/1988 | Takeda et al. | ............... | 438/158 |
| 5,976,902 A * | 11/1999 | Shih | ............................. | 438/30 |
| 6,338,989 B1* | 1/2002 | Ahn et al. | ................... | 438/158 |
| 6,620,655 B1* | 9/2003 | Ha et al. | ................... | 438/149 |
| 6,642,074 B1* | 11/2003 | Hong et al. | ................... | 438/30 |
| 6,888,597 B1* | 5/2005 | Ha et al. | ..................... | 349/114 |
| 2003/0122987 A1* | 7/2003 | Kim et al. | .................... | 349/43 |
| 2003/0123009 A1* | 7/2003 | Jo et al. | ..................... | 349/141 |

FOREIGN PATENT DOCUMENTS

| KR | 1999-79262 | 11/1999 |
|---|---|---|
| KR | 2000-10168 | 2/2000 |

* cited by examiner

*Primary Examiner*—Jennifer Kennedy
(74) *Attorney, Agent, or Firm*—McKenna Long & Aldridge LLP

(57) ABSTRACT

A thin film transistor array substrate, and its manufacturing method, that is made using a three-round mask process. Gate patterns, each of which includes a gate line consisting of a transparent metal pattern and a gate metal pattern, a gate electrode, a lower gate pad, a lower data pad, and a pixel electrode are formed using a first mask process. A second mask process forms a gate insulating pattern and a semiconductor pattern. A third mask process forms source and drain patterns, each of which includes a data line, a source electrode, a drain, electrode, an upper gate pad and an upper data pad. Additionally, the gate metal pattern on an upper portion of the pixel electrode is removed.

10 Claims, 24 Drawing Sheets

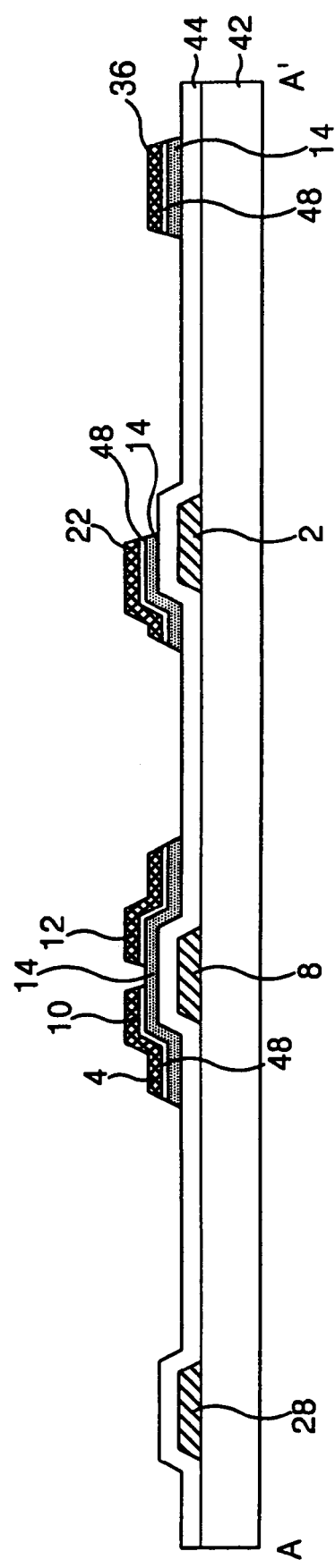

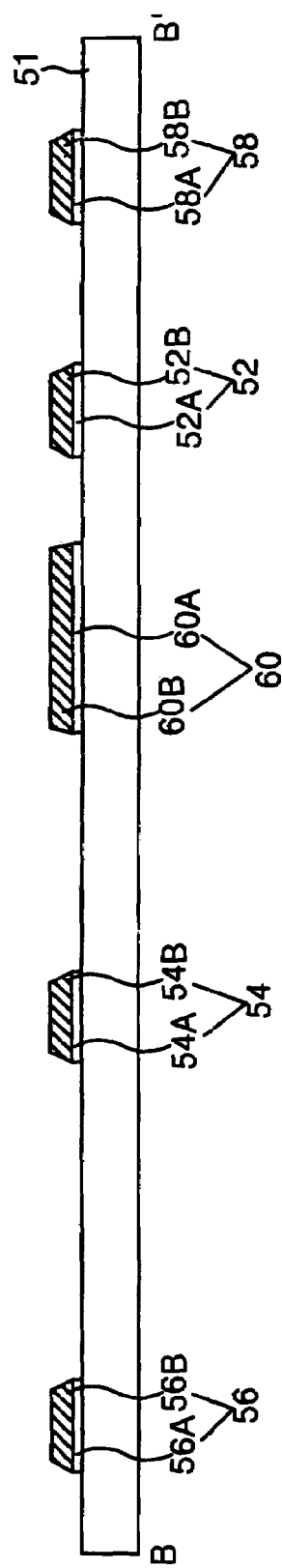

THIN FILM TRANSISTOR ARRAY SUBSTRATE AND MANUFACTURING METHOD THEREOF

This application is a divisional of prior application Ser. No. 10/273,891, filed Oct. 21, 2002 now U.S. Pat. No. 6,818,923.

BACKGROUND OF THE INVENTION

1. Field of the Invention

This invention relates to thin film transistor array substrates of the type used in liquid crystal displays. More particularly, this invention relates to a thin film transistor array substrate, and to its manufacturing method, that is fabricated using a reduced number of masks.

2. Description of the Related Art

Generally, a liquid crystal display (LCD) controls light transmittance using an electric field to produce an image. To this end, an LCD includes a liquid crystal panel having liquid crystal cells arranged in a matrix, and a driving circuit for driving the liquid crystal cells.

The liquid crystal display panel includes a thin film transistor array substrate and an opposed color filter array substrate. Spacers between two substrates main a constant cell gap, which is filled by a liquid crystal.

The thin film transistor array substrate has gate lines and data lines, thin film transistor switching devices at intersections of the gate lines and the data lines, pixel electrodes in liquid crystal cells defined by the crossing gate and data lines, with the pixel electrodes being connected to the thin film transistors, and alignment films. The gate lines and the data lines receive signals from driving circuits via pad portions. The thin film transistors apply pixel voltages on the data lines to the pixel electrodes in response to scanning signals applied to the gate lines.

The color filter array substrate consists of color filters for the liquid crystal cells, a black matrix that divides the color filters, a common electrode for applying a reference voltage to the liquid crystal cells, and an alignment film.

The liquid crystal display panel is made by preparing the thin film array substrate and the color filter array substrate individually, joining them, injecting a liquid crystal between those substrates, and then sealing the liquid crystal in place.

Since fabricating a thin film transistor array substrate requires multiple masking processes, manufacturing a thin film transistor array substrate is a major factor in the costs of a liquid crystal display panel. To reduce costs, significant effort has gone into reducing the required number of masking processes. This is because each mask process includes many sub-processes, such as deposition, cleaning, photolithography, etching, photo-resist stripping and inspection. While the standard thin film transistor array substrate manufacturing process used five masks, a newer four-mask process has been developed.

FIG. 1 is a plan view illustrating a thin film transistor array substrate made by the four-mask process, and FIG. 2 is a sectional view of the thin film transistor array substrate of FIG. 1 taken along line A–A'. The thin film transistor array substrate includes crossing gate lines 2 and data lines 4 on a lower substrate 42. A gate insulating film 44 separates the gate and data lines 2 and 4. A thin film transistor 6 is provided at each intersection, and pixel electrodes 18 are provided in liquid crystal cells defined by the gate and data lines 2 and 4. The thin film transistor array substrate includes storage capacitors 20 formed by overlaps of pixel electrodes 18 and gate lines 2. Additionally, gate pad portions 26 connect to the gate lines 2, and data pad portions 34 connects to the data lines 4.

Each thin film transistor 6 includes a gate electrode 8 that is connected to a gate line 2, a source electrode 10 that is connected to a data line 4, a drain electrode 12 that is connected to a pixel electrode 18, and an active layer 14 that overlap the gate electrode 8 and that defines a channel between the source electrode 10 and the drain electrode 12. The thin film transistor 6 allows a pixel voltage signal applied to the data line 4 to be applied to the pixel electrode and sustained on a storage capacitor in response to a gate signal applied to the gate line 2. The active layer 14 also overlaps the data pad 36, the storage electrode 22, and the data line 4. On the active layer 14 is an ohmic contact layer 48 for making an ohmic contact.

As shown in FIG. 1 and FIG. 2, the pixel electrode 18 is connected, via a first contact hole 16 through a protective film 50, to the drain electrode 12. The pixel electrode 18 is used for producing a potential difference with respect to a common electrode on the upper substrate (not shown) when charged with a pixel voltage. This potential difference rotates the liquid crystal between the thin film transistor array substrate and the upper substrate owing to dielectric anisotropy. Thus, the pixel voltage controls the amount of light emitted by the upper substrate from a light source input through the pixel electrode 18.

The storage capacitor 20 includes part of a "pre-stage" gate line 2. The storage capacitor 20 also includes a storage electrode 22 that overlaps the gate line 2, an interposed gate insulating film 44, an interposed active layer 14, and an interposed ohmic contact layer 48. A pixel-electrode 22 on the protective film 50 contacts the storage electrode 22 through a second contact hole 24. The storage capacitor 20 maintains the pixel voltage on the pixel electrode 18 until the next pixel voltage is applied.

The gate line 2 is connected, via the gate pad portion 26, to a gate driver (not shown). The gate pad portion 26 includes a gate pad 28, which extends from the gate line 2, and a gate pad protection electrode 32 that is connected, via a third contact hole 30 through the gate insulating film 44 and through the protective film 50, to the gate pad 28.

The data line 4 is connected, via the data pad portion 34, to a data driver (not shown). The data pad portion 34 includes a data pad 36 that extends from the data line 4, and a data pad protection electrode 40 that is connected, via a fourth contact hole 38 through the protective film 50, to the data pad 36.

Hereinafter, a method of fabricating the thin film transistor substrate of FIG. 1 and FIG. 2 will be described with reference to FIG. 3A to FIG. 3D. Referring to FIG. 3A, gate patterns are provided on the lower substrate 42. To do so, a gate metal layer is formed on the upper substrate 42 by deposition, possibly sputtering. Then, the gate metal layer is patterned by photolithography and etching using a first mask process to form the gate line 2, the gate electrode 8, and the gate pad 28. The gate metal layer can be a single-layer or double-layer structure of chrome (Cr), molybdenum (Mo), or aluminum.

Referring to FIG. 3B, the gate insulating film 44, the active layer 14, the ohmic contact layer 48, and source/drain patterns are sequentially formed on the structure shown in FIG. 3A. To do so, the gate insulating film 44, an undoped amorphous silicon layer, an n$^+$ amorphous silicon layer, and source/drain metal layer are sequentially provided by deposition, beneficially plasma enhanced chemical vapor deposition (PECVD) or sputtering. Then, a photo-resist pattern is formed on the source/drain metal layer by photolithography using a second mask. In this case, a diffractive exposure mask having a diffractive exposing part at the channel region of the thin film transistor is used as a second mask. This allows the photo-resist pattern at channel regions to have a lower height than the remainder of the photo-resist. Subsequently, the source/drain metal layer is patterned using a wet etching process to provide source/drain patterns that include the data line 4, the source electrode 10, the drain electrode 12 (which at this time is integral with the source electrode 10), and the storage electrode 22.

Next, the n+ amorphous silicon layer and the amorphous silicon layer are patterned using a dry etching process and using the same photo-resist pattern to provide the ohmic contact layer 48 and the active layer 14. The photo-resist pattern with the relatively low height is removed from the channel portion by an ashing process. Thereafter, the source/drain pattern and the ohmic contact layer 48 at the channel portion are etched by a wet etching process. Thus, part of the active layer 14 is exposed, thus disconnecting the source electrode 10 from the drain electrode 12 (until a conductive channel is formed). Then, the remaining photo-resist pattern is removed by a stripping process. The gate insulating film 14 is made from an inorganic insulating material such as silicon nitride ($SiN_x$) or silicon oxide ($SiO_x$). The source/drain metal is molybdenum (Mo), titanium (Ti), tantalum (Ta), or a molybdenum alloy.

Referring to FIG. 3C, the protective film 50 having the first through the fourth contact holes 16, 24, 30 and 38 are formed on the structure shown in FIG. 3B. The protective film 50 is provided by a deposition technique such as plasma enhanced chemical vapor deposition (PECVD). The protective film 50 is then patterned by photolithography using a third mask and an etch process to define the first to the fourth contact holes 16, 24, 30 and 38. The first contact hole 16 is formed through the protective film 50 to expose a portion of the drain electrode 12. The second contact hole 24 is formed through the protective film 50 and to expose a portion of the storage electrode 22. The third contact hole 30 is formed through the protective film 50 and through the gate insulating film 44 to expose a portion of the gate pad 28. The fourth contact hole 38 is formed through the protective film 50 to expose a portion of the data pad 36. The protective film 50 is made from an inorganic material that is identical to the gate insulating film 44, or from an organic material having a small dielectric constant, such as an acrylic organic compound, BCB (benzocyclobutene) or PFCB (perfluorocyclobutane).

Referring now to FIG. 3D, transparent electrode patterns are then provided on the protective film 50. To do so, a transparent electrode material is deposited on the structure shown in FIG. 3C using a deposition technique such as sputtering. Then, the transparent electrode material is patterned by photolithography using a fourth mask and an etching process to provide the transparent electrode patterns. That pattern includes the pixel electrode 18, the gate pad protection electrode 32, and the data pad protection electrode 40. The pixel electrode 18 is electrically connected via the first contact hole 16 to the drain electrode 12, and to the storage electrode 22 via the second contact hole 24. Additionally, the pixel electrode 18 overlaps part of the pre-stage gate line 2. The gate pad protection electrode 32 is electrically connected via the third contact hole 30 to the gate pad 28. The data pad protection electrode 40 is electrically connected via the fourth contact hole 38 to the data pad 36. The transparent electrode material is comprised of indium-tin-oxide (ITO), tin-oxide (TO), or of indium-zinc-oxide (IZO).

As described above, the conventional four-round mask process thin film transistor substrate is simpler than the prior five-round mask process. Hence manufacturing costs are reduced. However, the four-round mask process might not be optimal. Therefore, a novel thin film transistor array substrate, and a novel manufacturing method thereof, that have even simpler manufacturing processes would be beneficial.

SUMMARY OF THE INVENTION

Accordingly, it is an object of the present invention to provide a thin film transistor array substrate, and a manufacturing method thereof, using a three-round mask process.

To achieve these and other objects of the present invention, a thin film transistor array substrate according to one aspect of the present invention includes crossing gate and data lines having a gate insulating pattern therebetween; pixel electrode formed at cell areas defined by the crossing gate and data lines; and thin film transistors. Each thin film transistor includes a gate electrode that is connected to a gate line, a source electrode that is connected to a data line, a drain electrode that is connected a pixel electrode, and a semiconductor pattern for providing a channel between the source electrode and the drain electrode. Additionally, a gate pad portion that includes a lower gate pad and an upper gate pad connect to the gate line, and a data pad portion that includes a lower data pad and an upper data pad connect to the data line. The gate patterns, including the gate line, the gate electrode, the lower gate pad, and the lower data pad, are comprised of a transparent electrode pattern and of a gate metal pattern. Each of the source/drain patterns, including the data line, the source electrode, the drain electrode, the upper gate pad, and the upper data pad are comprised of a source/drain metal. The semiconductor pattern extends along the data line and along the gate line (together with the gate insulating pattern). However, the semiconductor pattern is opened between liquid crystal cells.

The thin film transistor array substrate further includes storage capacitors, each of which is comprised of part of a gate line, a storage electrode that overlaps the gate line, part of the gate insulating pattern, and part of the semiconductor pattern. The storage capacitor is electrically connected to the pixel electrode.

Alternatively, the thin film transistor array substrate has a storage capacitor comprised of part of the gate line, a storage electrode that overlaps the gate line, and part of the gate insulating pattern. Again, the storage capacitor is electrically connected to the pixel electrode.

In the thin film transistor array substrate, the semiconductor pattern on the gate insulating pattern is removed such that the gate insulating pattern is exposed.

The gate pad portions are formed such that a transparent electrode pattern is exposed through a first hole that passes through the gate metal pattern in the upper gate pad and in the lower gate pad. The data pad portion is formed such that the transparent electrode pattern is exposed through a second hole that passes through the gate metal pattern in the upper data pad and in the lower data pad.

The thin film transistor array substrate is protected by an alignment film that is provides for a liquid crystal alignment.

A method of manufacturing a thin film transistor array substrate according to another aspect of the present invention includes forming gate patterns on a substrate using a first mask process. The gate patterns include a gate line comprised of a transparent metal pattern and of a gate metal pattern, a gate electrode, a lower gate pad, a lower data pad, and a pixel electrode. Then, a second mask process that forms a gate insulating pattern and a semiconductor pattern is used. Then, a third mask that forms source/drain patterns is used. The source/drain patterns include data lines, source electrodes, drain electrodes, upper gate pads, and upper data pads. Also, in the second mask process the gate metal patterns on the upper portions of the pixel electrodes, are removed.

The third mask process includes forming storage electrodes over the gate insulating film and over the semiconductor patterns. Each storage electrode overlaps part of the gate line. Additionally, each storage electrode electrically connects to a pixel electrode.

The second mask process includes disposing a gate insulating layer and a semiconductor layer on the substrate; forming a photo-resist pattern that includes a first area and a second area having a lower height than the first area. A diffractive exposure mask or a semi-transmitting mask can be used. Then, the photo-resist pattern is used to etch the gate insulating layer. Also, thin film transistor areas comprised of gate electrodes, source electrodes, drain electrodes, the gate insulating pattern, and the semiconductor patterns that overlap the gate line and the data line are formed by etching. Then, the second area of the photo-resist pattern is removed by an ashing process. Thereafter, etching is performed on the newly exposed portion of the semiconductor pattern to expose the gate insulating pattern. Then, the remaining photo-resist pattern is removed.

The area from which the semiconductor pattern is removed to expose the gate insulating pattern includes the remaining area excluding an area overlapping the source electrode, the drain electrode and the channel portion between the source electrode and the drain electrode; and a partial area between the cells in the gate line.

When the semiconductor pattern is removed, the semiconductor pattern overlapped by the storage electrode can also be removed.

BRIEF DESCRIPTION OF THE DRAWINGS

These and other objects of the invention will be apparent from the following detailed description of the embodiments of the present invention with reference to the accompanying drawings, in which:

FIG. 3A to FIG. 3D are sectional views for illustrating a method of manufacturing the thin film transistor array substrate shown in FIG. 2;

FIG. 6A and FIG. 6B are, respectively, a plan view and a sectional view that are useful for explaining a first mask process in the method of manufacturing the thin film transistor array substrate shown in FIG. 4 and FIG. 5;

DETAILED DESCRIPTION OF THE PREFERRED EMBODIMENT

Figure 1:
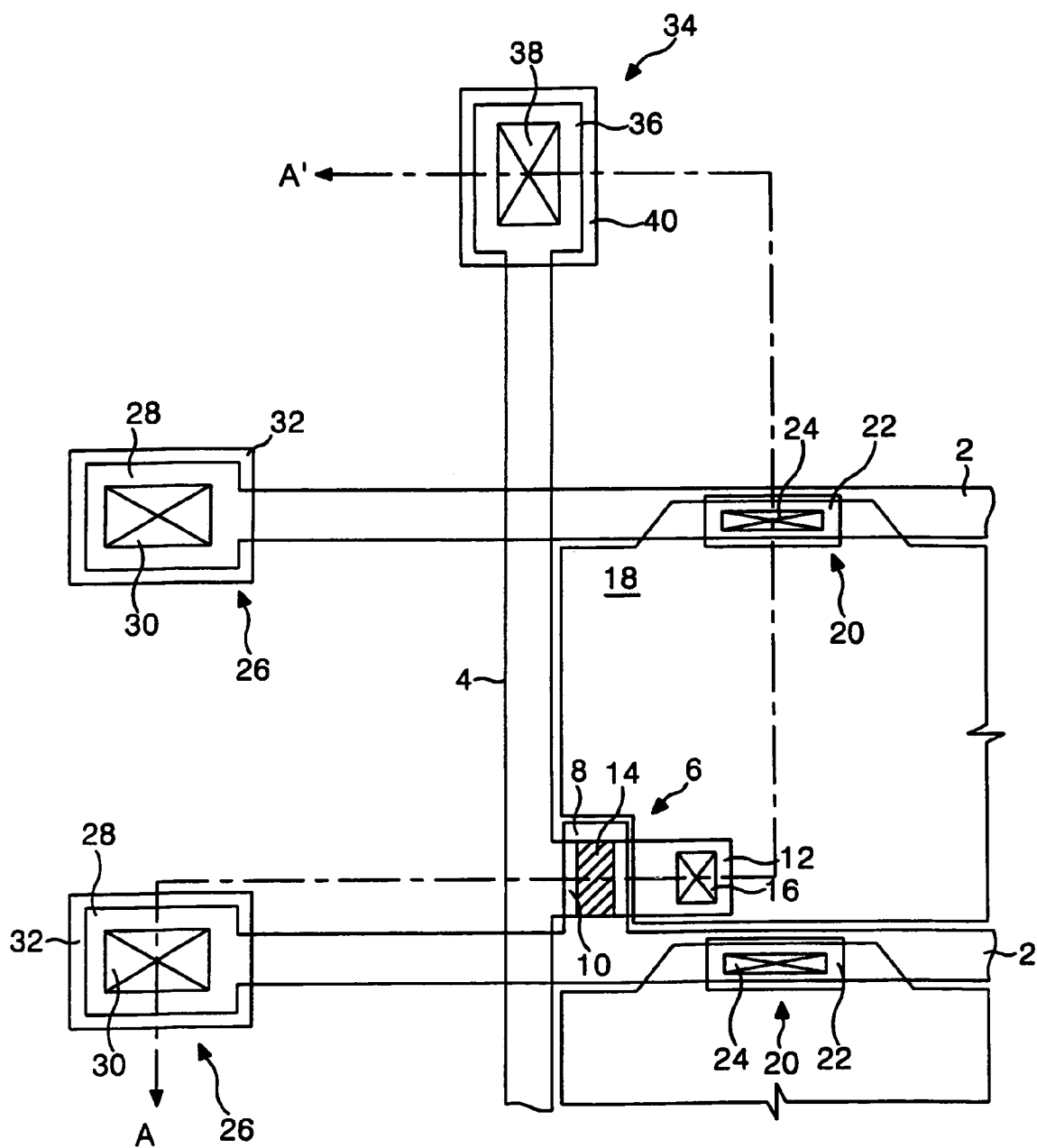
FIG. 1 is a plan view showing a portion of a thin film transistor array substrate of a conventional liquid crystal display.
Figure 2:
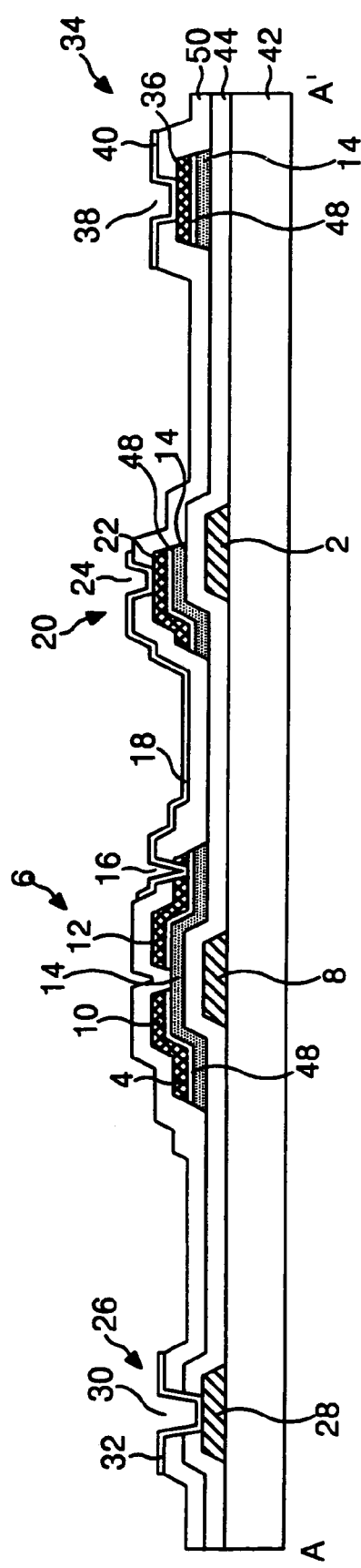
FIG. 2 is a sectional view of the thin film transistor array substrate of FIG. 1 taken along line A–A'.
Figure 3A:
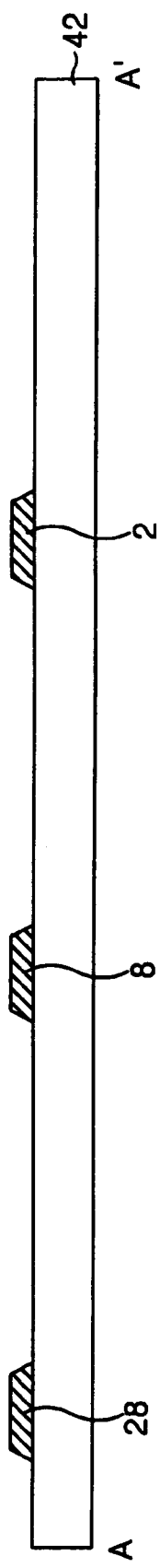
Figure 3C:
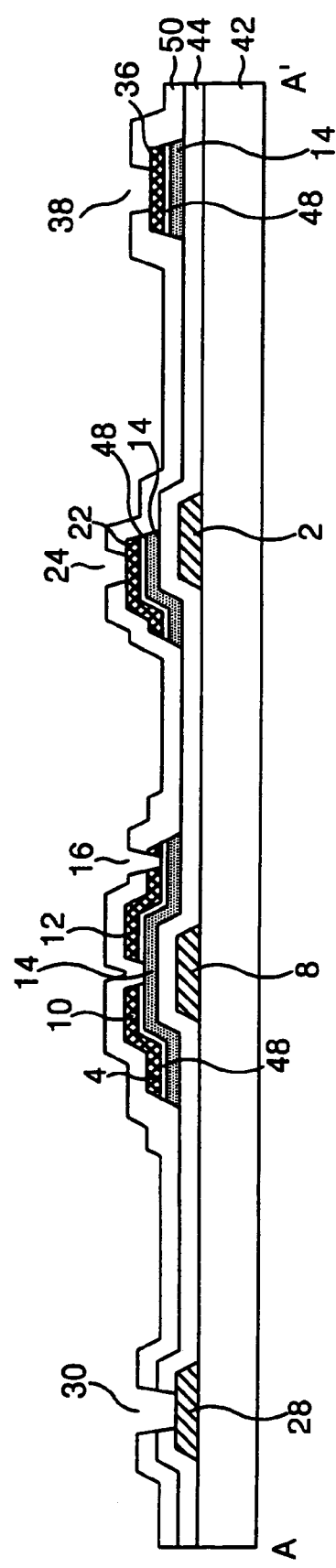
Figure 3D:
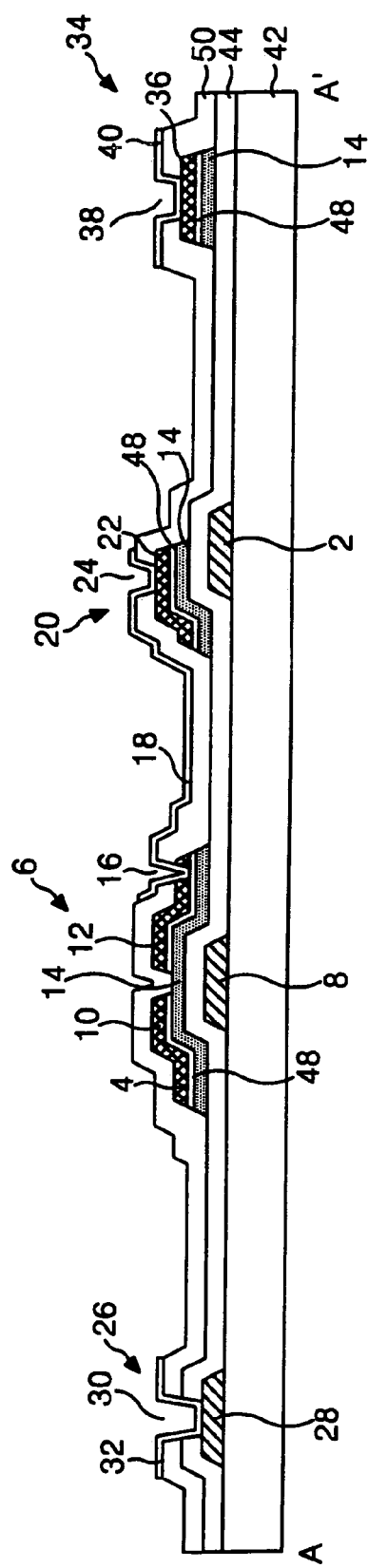
Figure 4:
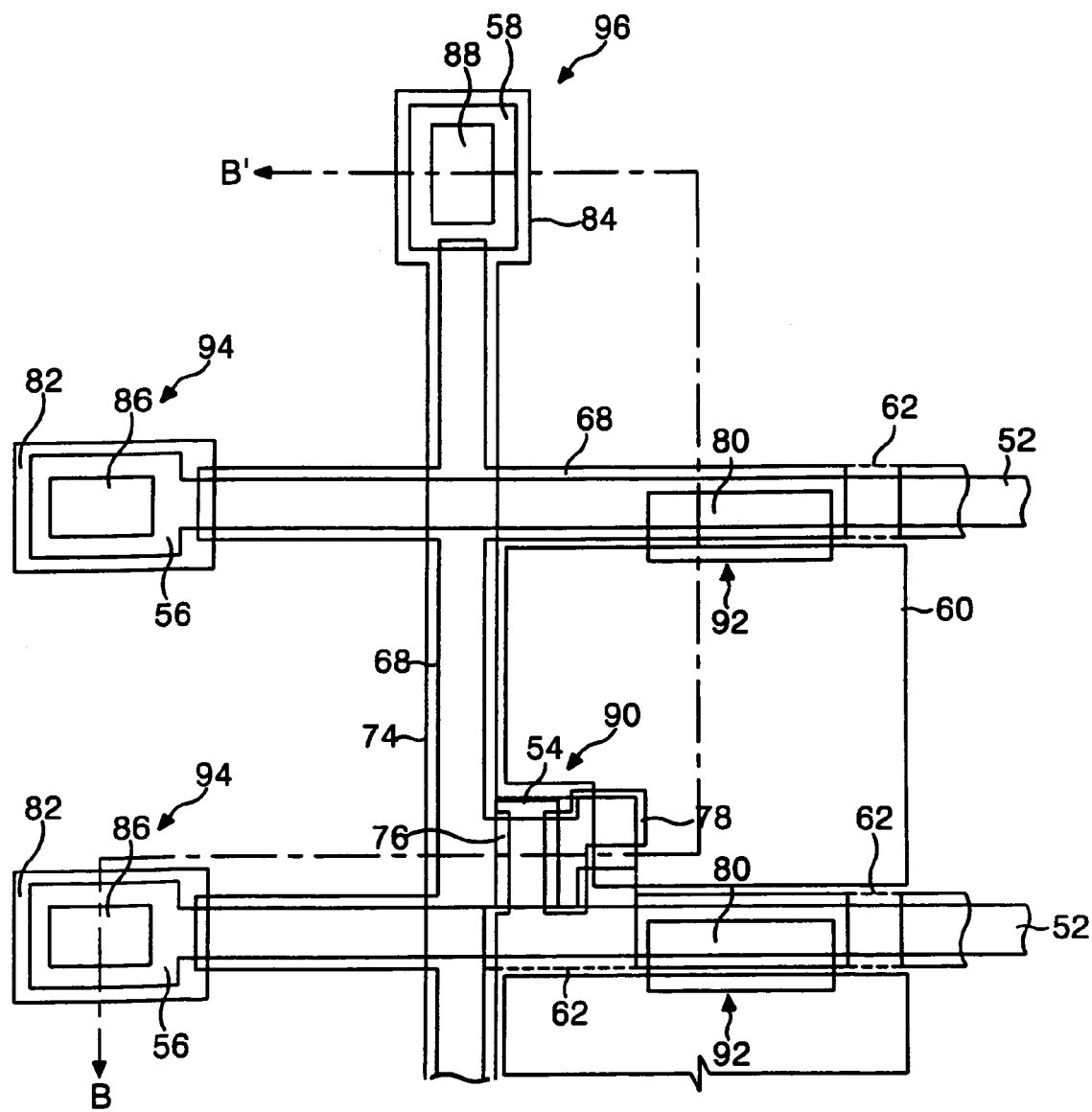
FIG. 4 is a plan view showing a thin film transistor array substrate according to an embodiment of the present invention.
Figure 5:
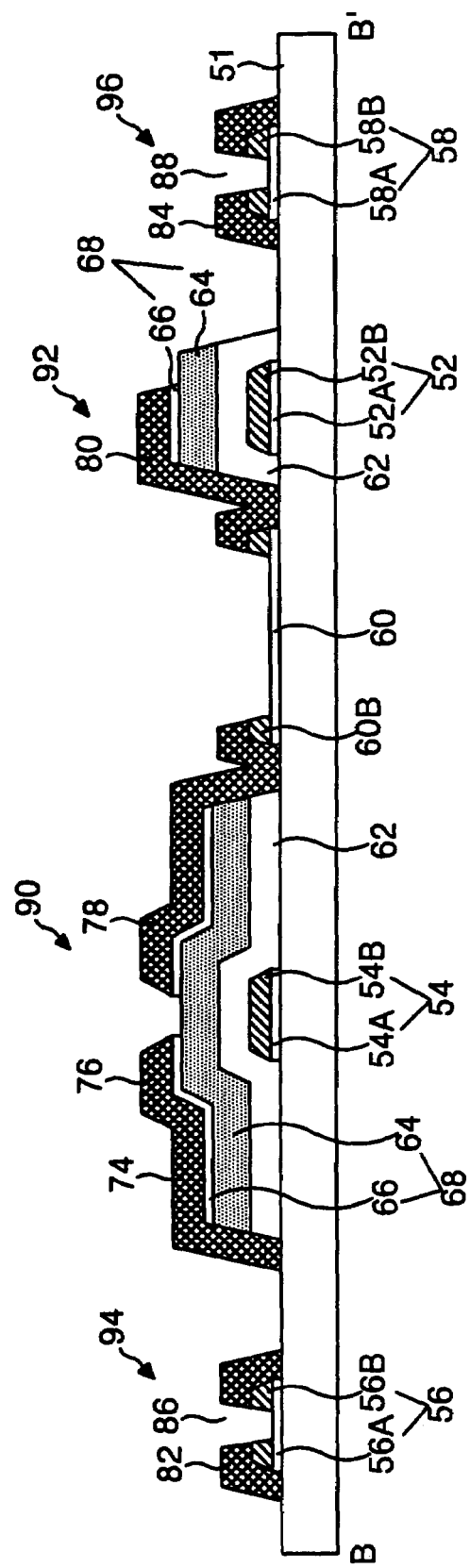
FIG. 5 is a sectional view of the thin film transistor array substrate of FIG. 4 taken along line B–B'.

FIG. 4 is a plan view showing a thin film transistor array substrate according to an embodiment of the present invention, and FIG. 5 is a sectional view of the thin film transistor array substrate of FIG. 4 taken along line B–B'. Referring to both FIG. 4 and FIG. 5, the thin film transistor array substrate includes crossing gate lines 52 and data lines 74 (only one is shown) on a lower substrate 51. A gate insulating pattern 62 insulates the crossing gate and data lines 52 and 74. A thin film transistor 90 is provided at each intersection, and a pixel electrode 60 is provided in each liquid crystal cell defined by the crossing gate and data lines 52 and 74. The thin film transistor array substrate further includes storage capacitors 80 at portions of the (pre-stage) gate lines 52 that are overlapped by the pixel electrodes 60. As shown, gate pad portions 94 connect to the gate lines 52, and data pad portions 96 connect to the data lines 74.

Each thin film transistor 90 includes a gate electrode 54 that is connected to a gate line 52, a source electrode 76 that is connected to a data line 74, a drain electrode 78 that is connected to a pixel electrode 60, and a semiconductor pattern 68 that overlaps the gate electrode 54. A portion of the gate insulating pattern 62 is disposed between the semiconductor pattern 68 and the gate electrode 54. The semiconductor pattern is for defining a channel between the source electrode 76 and the drain electrode 78. The thin film transistor 90 switches a pixel voltage signal applied to the data line 74 onto the pixel electrode 60 and into the storage capacitors 80 in response to gate signals applied to the gate line 52.

The gate electrode 54 and the gate line 52 are comprised of transparent electrode patterns 52A and 54A and gate metal patterns 52B and 54B. This is because the gate electrodes 54 and gate lines 52 are formed simultaneously with the pixel electrode 60.

The semiconductor pattern 68 includes an ohmic contact layer 66 and an active layer 64. The active layer 64 forms a channel between the source electrode 76 and the drain electrode 78. The semiconductor pattern 68 is overlapped by the data line 74. Additionally, portions of the ohmic contact layer 66 and active layer 64 are overlapped by the storage electrode 80. Those portions in turn overlap the gate insulating patterns 62 over the gate lines 52. The ohmic contact layer 66 provides ohmic contacts with the storage electrode 80, with the data line 74, with the source electrode 76, and with the drain electrode 78. The semiconductor pattern 68 is formed in such a manner as to overlap the gate line 52 and its gate insulating pattern 62, while also being opened between the liquid crystal cells and the gate insulating pattern 62 only should be left. The opening is to prevent signal interference between liquid crystal cells caused by the semiconductor pattern 68 itself As shown, the pixel electrode 60 on the lower substrate 51 is connected to the drain electrode 78 of the thin film transistor 90. The voltage on the pixel electrode 60 produces a potential difference with respect to a common electrode on an upper substrate (not shown), when a pixel voltage is applied. This potential difference rotates a liquid crystal between the thin film transistor substrate 51 and the upper substrate owing to a dielectric anisotropy. This controls the light from a light source (not shown) that passes through the pixel electrode 60 toward the upper substrate.

Each storage capacitor 92 is associated with a pre-stage gate line 52. That is, the gate line 52 that is associated with the thin film transistors that are turned on in the previous gate drive period. The storage electrode 80 overlaps its gate line 52, the gate insulating pattern 62, the active layer 64, and the ohmic contact layer 66 that are over the gate line 52. Additionally, the storage electrode 80 connects to the pixel electrode 60. The storage capacitor 92 retains the pixel voltage on the pixel electrode 60 until the next pixel voltage is applied.

The gate line 52 is connected, via the gate pad portion 94, to a gate driver (not shown). The gate pad portion 94 is comprised of a lower gate pad 56 that is extended from the gate line 52, and an upper gate pad 82 that is connected to the lower gate pad 56. The lower gate pad 56 is comprised of a transparent electrode pattern 56A and of a gate metal pattern 56B.

The data line 74 is connected, via the data pad portion 96, to a data driver (not shown). The data pad portion 96 is comprised of a lower data pad 58 that is formed simultaneously with the lower gate pad 56, and an upper data pad 84 that is extended from the data line 74 and that connects to the lower data pad 58. The lower data pad 58 is comprised of a transparent electrode pattern 58A and of a gate metal pattern 58B.

A three-round mask process forms the thin film transistor array substrate having the above-mentioned structure. A method of manufacturing the thin film transistor array substrate according to the embodiment of the present invention includes a first mask process for providing the gate patterns and the pixel electrode, a second mask process for providing the gate insulating film, the active layer and the ohmic contact layer, and a third mask process for providing the source/drain patterns.

Figure 6A:
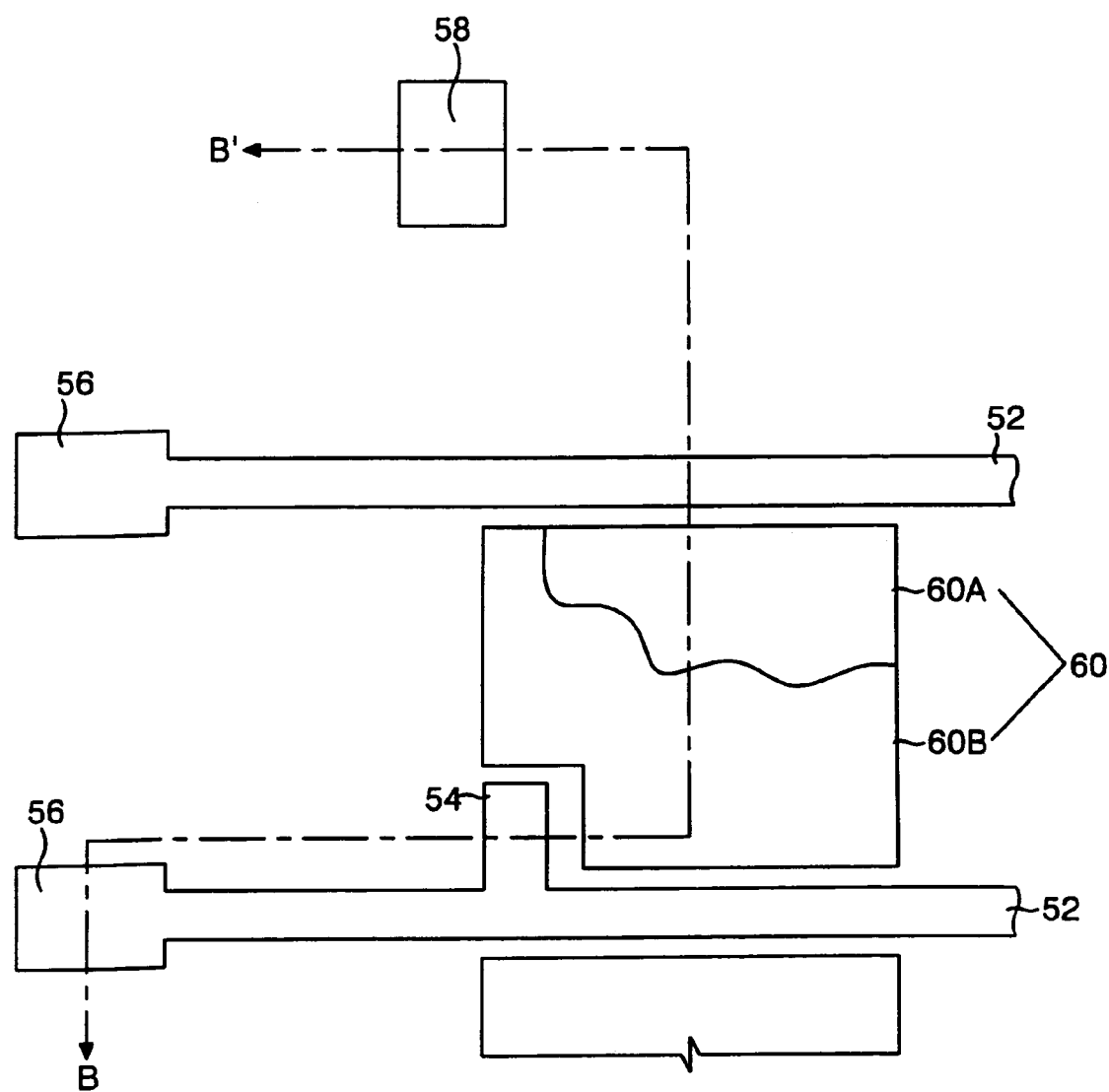

FIG. 6A and FIG. 6B are, respectively, a plan view and a sectional view for explaining the first mask process in the method of manufacturing the thin film transistor array substrate illustrated in FIG. 4 and FIG. 5. Referring to FIG. 6A and FIG. 6B, a transparent electrode layer and a gate metal layer are sequentially formed on the lower substrate 51 by a deposition technique such as sputtering. Then, the gate metal layer and the transparent electrode layer are patterned by photolithography using a first mask and etching to form gate patterns. Those gate patterns include the gate line 52, the gate electrode 54, the lower gate pad 56, the lower data pad 58, and the pixel electrode 60. As the gate metal layer and the transparent metal layer are patterned at the same time, each gate pattern has a two-layer structure in which transparent electrode patterns (52A, 54A, 56A and 58A) and gate metal patterns (52B, 54B, 56B and 58B) are stacked. Additionally, a gate metal pattern 60B remains on the pixel electrode 60. The gate metal layer is beneficially a single-layer or double-layer structure of chrome (Cr), molybdenum (Mo), or an aluminum group metal. The transparent electrode material is beneficially indium-tin-oxide (ITO), tin-oxide (TO) or indium-zinc-oxide (IZO).

Figure 7A:
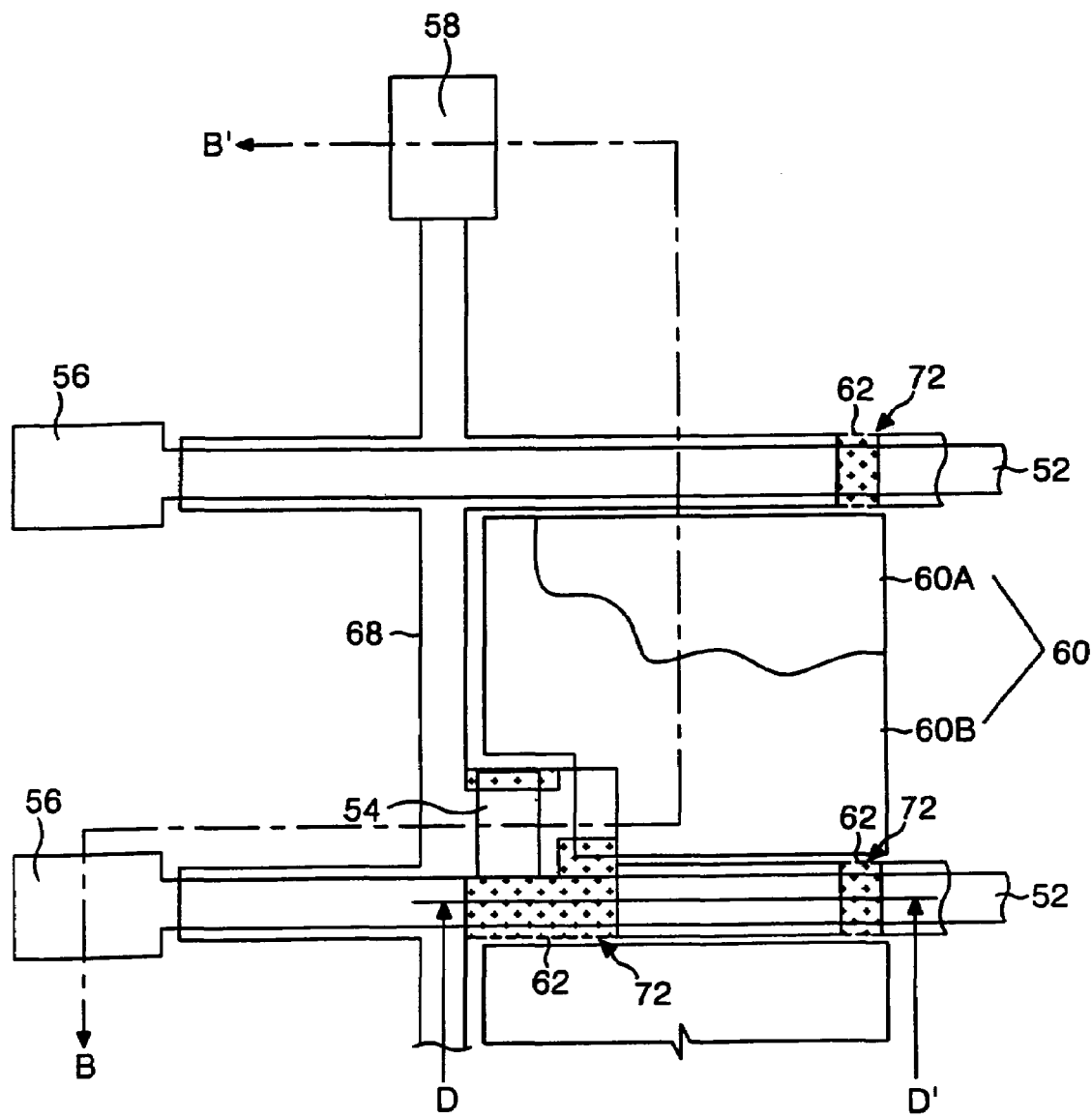
FIG. 7A and FIG. 7B are, respectively, a plan view and a sectional view for explaining a second mask process in the method of manufacturing the thin film transistor array substrate shown in FIG. 4 and FIG. 5.
Figure 7B:
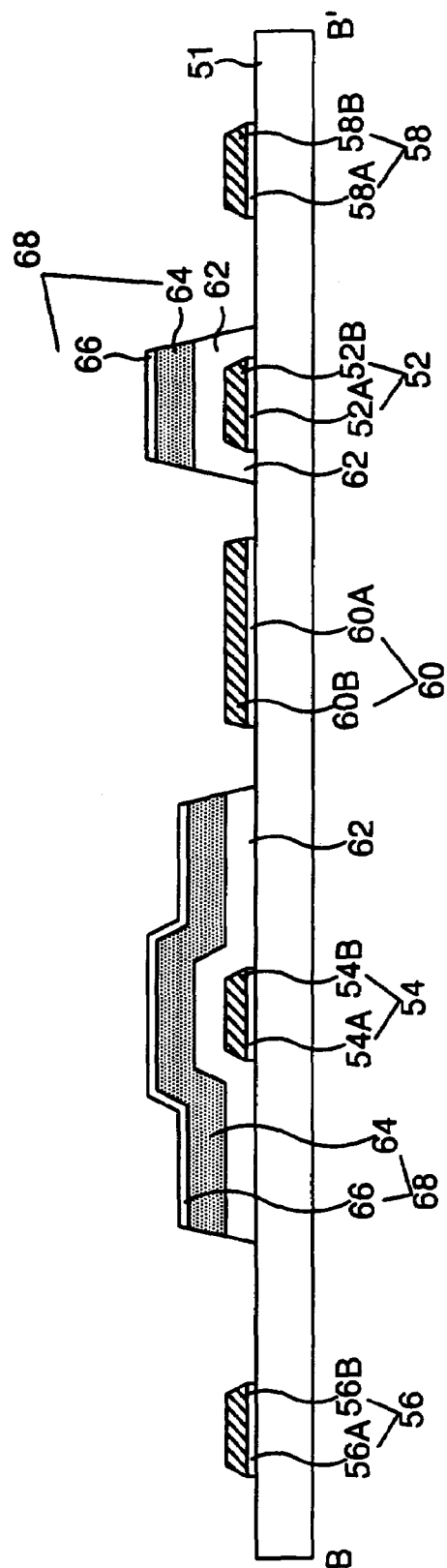

FIG. 7A and FIG. 7B are, respectively, a plan view and a sectional view of a substrate having the gate insulating patterns 62, the semiconductor pattern 68, and a semiconductor layer that is comprised of the active layer 64 and the ohmic contact layer 66 that are formed by a second mask process. Referring to FIG. 7A and FIG. 7B, on the structure of FIG. 6A and 6B, a gate insulating layer, an undoped amorphous silicon layer, and an $n^+$ amorphous silicon layer are sequentially deposited, possibly by using plasma enhanced chemical vapor deposition (PECVD) or sputtering. The gate insulating layer is an inorganic insulating material such as silicon nitride ($SiN_x$) or silicon oxide ($SiO_x$). Then, the $n^+$ amorphous silicon layer, the undoped amorphous silicon layer, and the gate insulating layer are patterned by photolithography using a second mask and etching to provide the gate insulating pattern 62 and the semiconductor pattern 68. The semiconductor pattern 68 has a double-layer structure of the active layer 64 and the ohmic contact layer 66. The semiconductor pattern 68 matches the lower gate insulating pattern 62. However, the second mask included a diffractive exposure mask portion or a semi-transmitting mask portion to selectively eliminate the semiconductor pattern 68 from areas where the thin film transistor and where the gate lines 52 are to be formed.

Figure 8A:
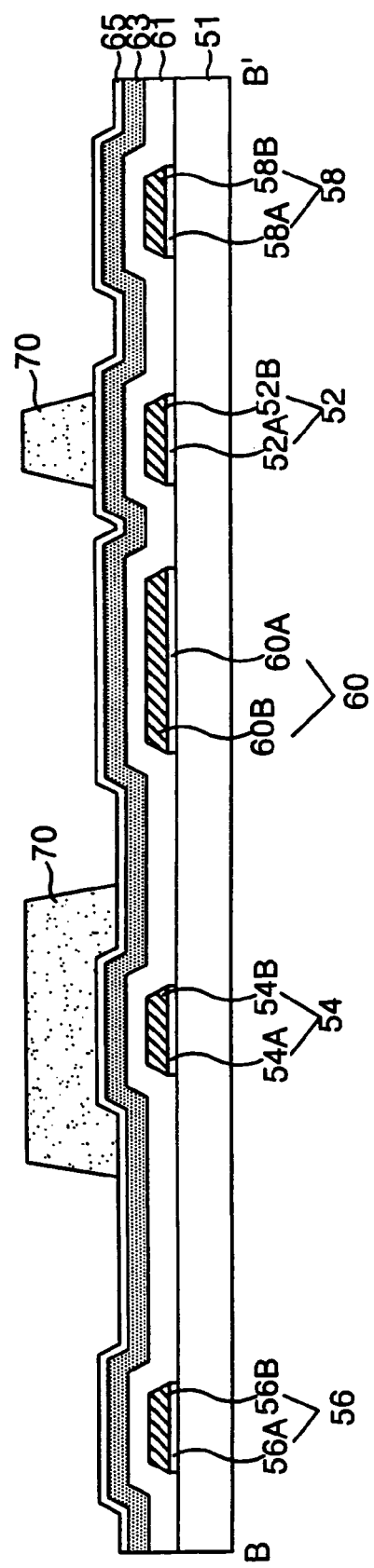
FIG. 8A to FIG. 8F are views useful for explaining the second mask process in more detail.
Figure 8B:
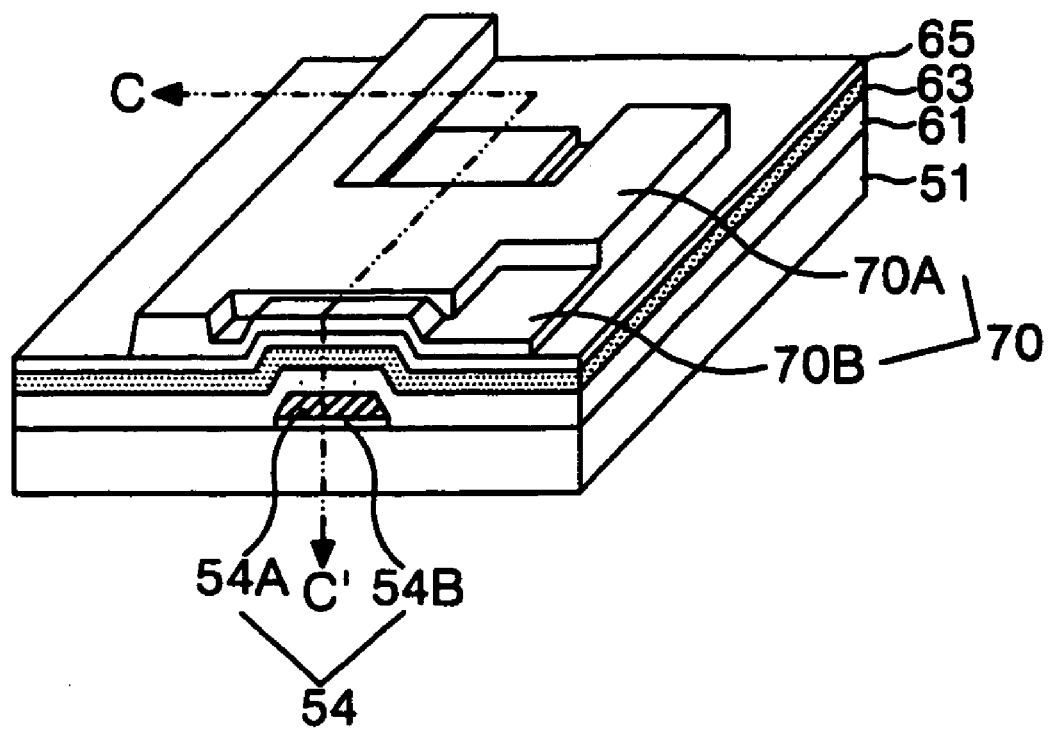

The second mask process will be described in more detail with reference to FIG. 8A to FIG. 8E. Referring to FIG. 8A, a gate insulating layer 61, an amorphous silicon layer 63, and an $n^+$ amorphous silicon layer 65 are formed. Thereafter, a photo-resist material is applied to form a photo-resist layer. That layer is then pattern to form a photo-resist 70 using the second mask. In this case, the second mask has a diffractive exposing part at specific area. Alternatively, a semi-transmitting mask having a semi-transmitting part at a specific area may be used. If a diffractive exposure mask is used, then the photo-resist pattern 70 is formed only at areas to be shielded. FIG. 8B is a perspective view of the photo-resist pattern 70. As shown, the photo-resist pattern 70 has a shielding area 70A, which as not formed by the diffractive exposing area, and a shielding area 70B that corresponds to the diffractive exposing part of the second mask. The shielding area 70B has a lower height than the shielding area 70A. The diffractive exposed shielding area 70B is located where the semiconductor pattern 68 should be partially removed. That is, at the thin film transistor area and at the gate line area as shown in FIG. 7A.

Figure 8C:
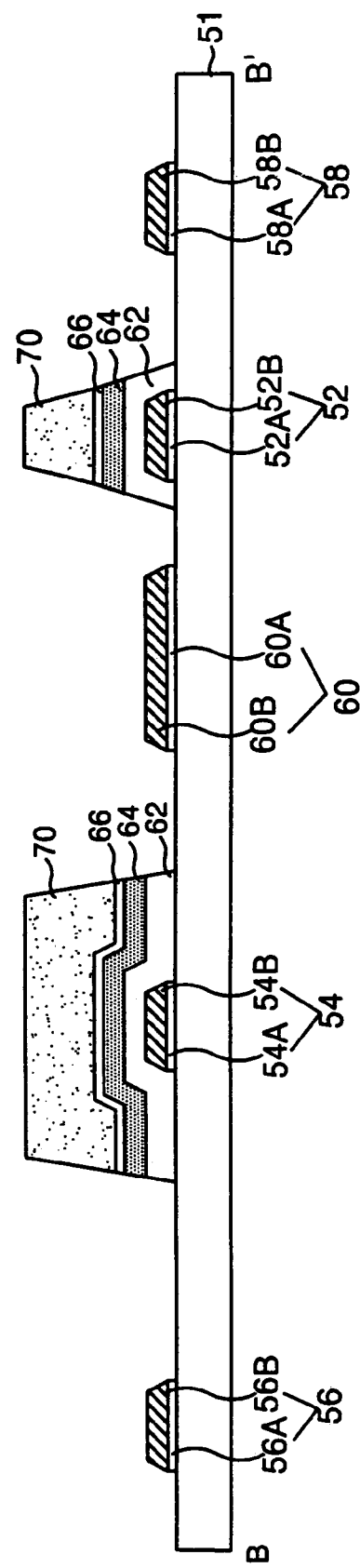
Figure 8D:
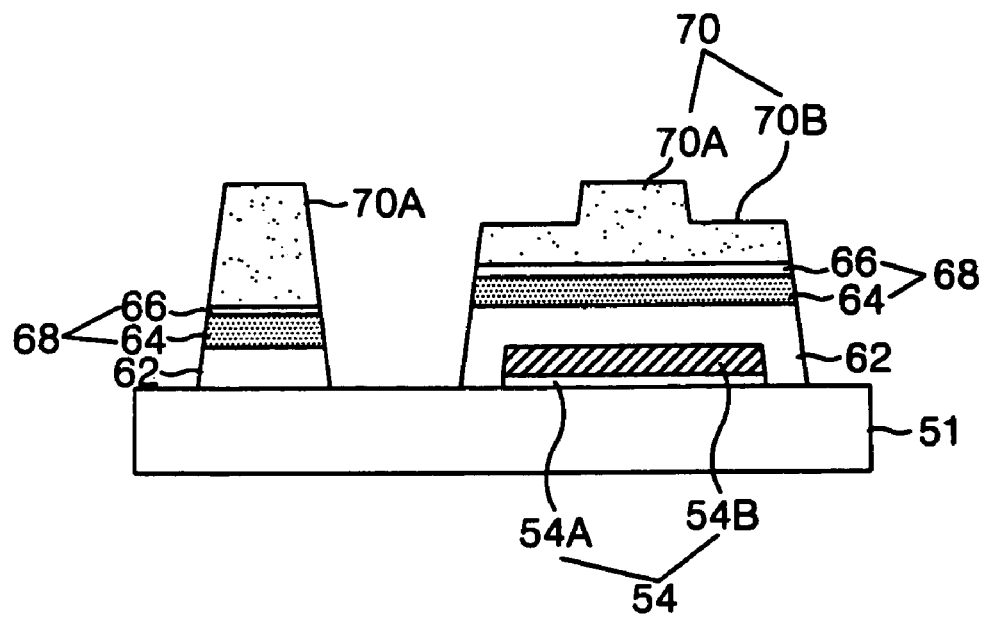

Subsequently, the $n^+$ amorphous silicon layer 66, the amorphous silicon layer 63, and the gate insulating layer 61 are patterned at the same time by etching while using the photo-resist pattern 70 as a mask. This forms the gate insulating pattern 62 and the semiconductor pattern 68 as shown in FIG. 8C and FIG. 8D. FIG. 8D is a perspective view of the thin film transistor area taken along the C–C' line in FIG. 8.

Figure 8E:
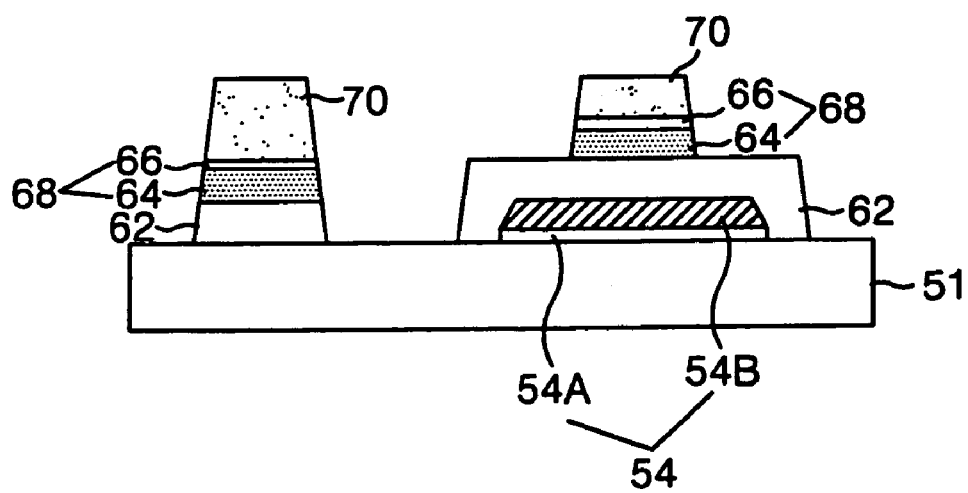
Figure 8F:
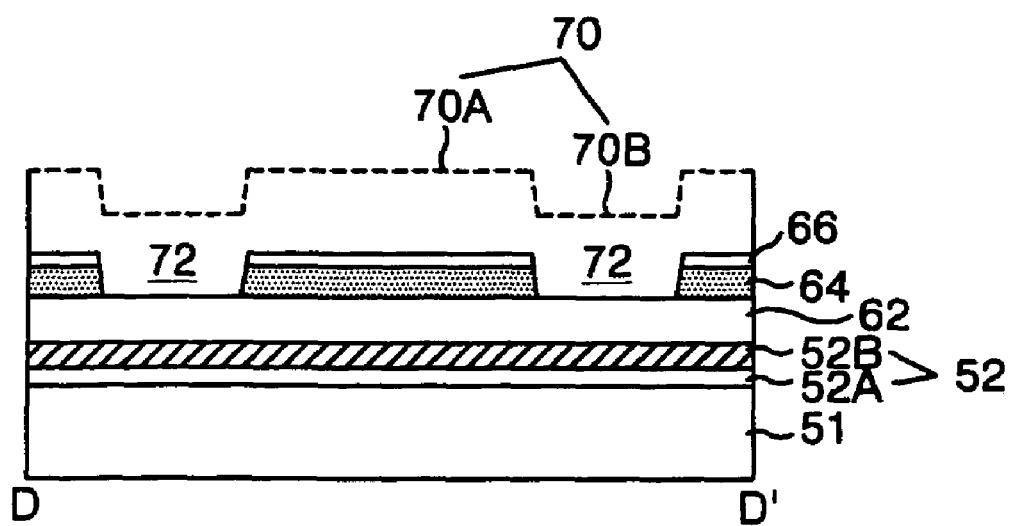

Then, as shown in FIG. 8E and 8F, the diffractive exposed area 70B is removed from the photo-resist pattern 70 by an ashing process that uses an oxygen ($O_2$) plasma. After ashing, while the shielding area 70A remains, it has a reduced height. Then, the semiconductor pattern 68 is partially removed by a dry etch process while using the remaining photo-resist pattern 70 (shielding area 70A) as a mask and the gate insulating pattern 62 only should be left. Herein, an area where the semiconductor pattern 68 is removed corresponds to the remaining area 72, excluding an area where the channel and the source and drain electrodes are formed from the thin film transistor area as, shown in FIG. 7A. This reduces light-induced leakage current from activation of the semiconductor pattern 68 by light when the semiconductor pattern 68 is exposed to the light in such a state that the semiconductor pattern 68 does not overlap the source and drain electrodes. Further, as shown in FIG. 8F, the semiconductor pattern 68 is partially removed from the area 72 between the liquid crystal cells to prevent signal interference between the liquid crystal cells caused by the semiconductor pattern 68 overlapping the gate line 52. The remaining photo-resist pattern 70 is then removed by a stripping process.

Figure 9A:
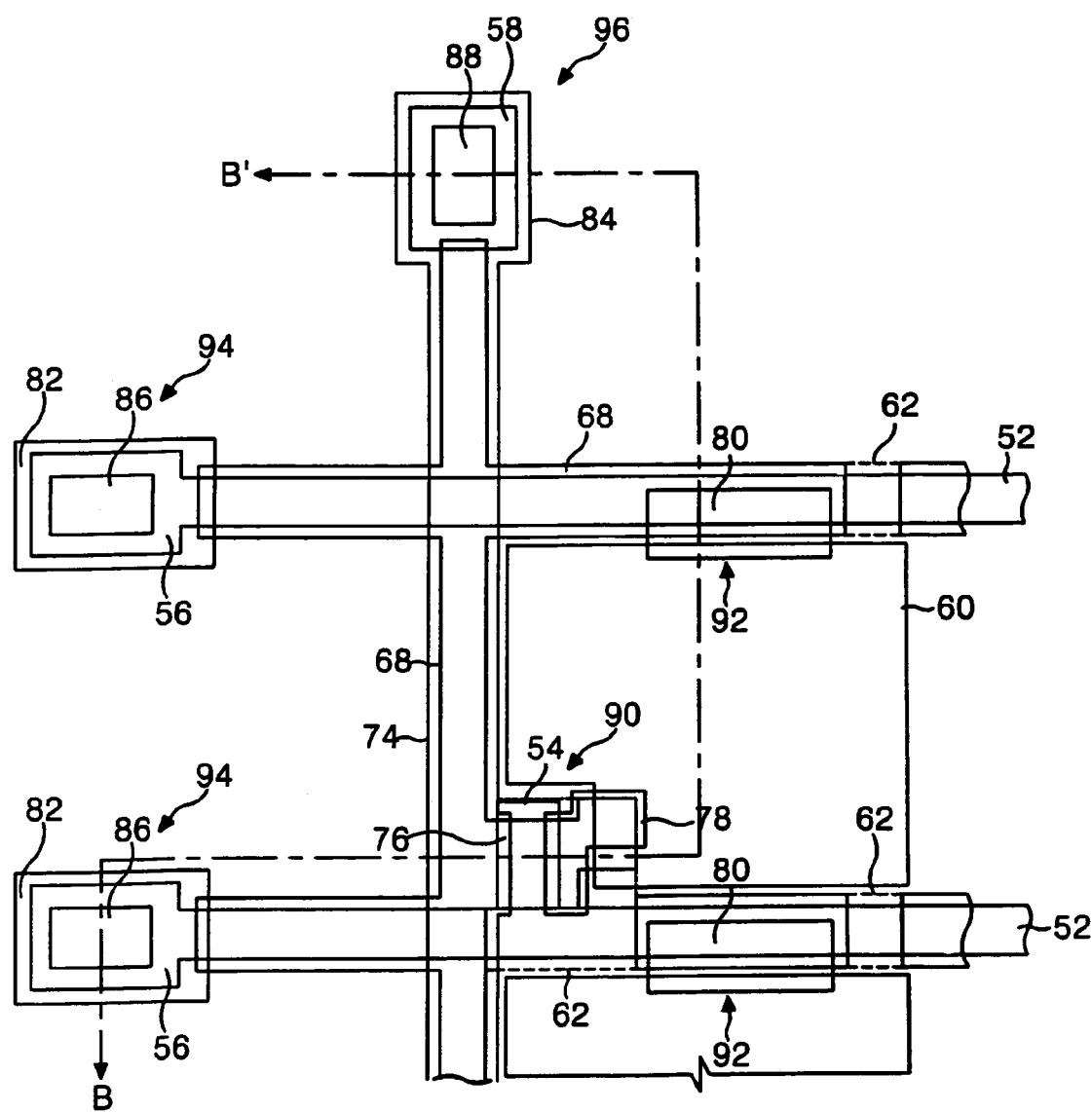
FIG. 9A and FIG. 9B are, respectively, a plan view and a sectional view for explaining a third mask process in the method of manufacturing the thin film transistor array substrate shown in FIG. 4 and FIG. 5.
Figure 9B:
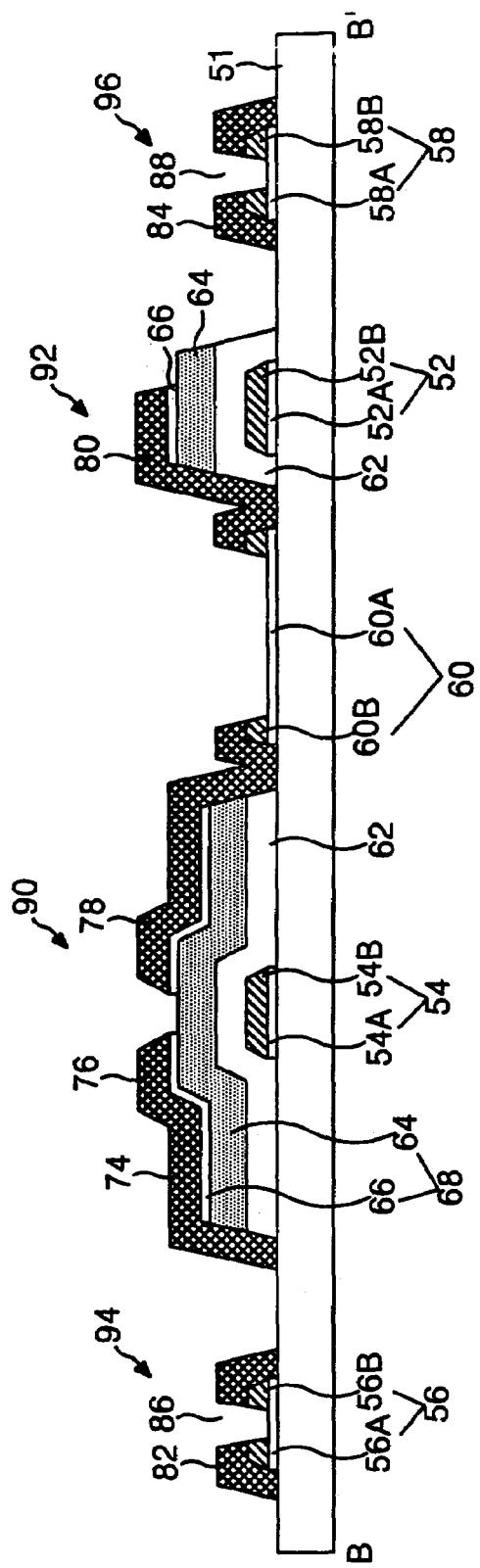

FIG. 9A and FIG. 9B are, respectively, a plan view and a sectional view that are useful for explaining a third mask process in the method of manufacturing the thin film transistor array substrate according to the embodiment of the present invention. A source/drain metal layer is provided on the lower substrate 51 after the second masking process is completed. Then, the source/drain metal layer is patterned by photolithography using a third mask and etching to provide the source/drain patterns. The source/drain patterns include the data line 74, the source electrode 76, the drain electrode, 78, the storage electrode 80, the upper gate pad 82 and the upper data pad 84. Particularly, when the source/drain metal layer is patterned, the gate metal patterns 56B, 58B and 60B are patterned. Thus, the gate metal pattern 60B in areas which are not overlapped by the drain electrode 78 or by the storage electrode 80 is removed so as to expose the pixel electrode 60. Furthermore, the gate metal pattern 56B at the middle of the upper gate pad 82 of the gate pad portion 94 is removed to define a first hole 86. The transparent electrode pattern 56B included in the lower gate pad 56 is exposed through the first hole 86. Similarly, the gate metal pattern 56B at a middle of the upper data pad 84 is removed from the data pad portion 96 to define a second hole 88. The transparent electrode pattern 56B included in the lower data pad 58 is exposed through the second hole 88.

The ohmic contact layer 66 between the source electrode 76 and the drain electrode 78 is then removed by a dry etching process using the source electrode 76 and the drain electrode 78 as a mask. This enables formation of a channel in the active layer 64.

Herein, the source/drain metal is beneficially comprised of molybdenum (Mo), titanium (Ti), tantalum (Ta), or of a molybdenum alloy.

The thin film transistor array substrate manufactured in such a three-round mask process is protected by an alignment film that provides the alignment direction of the liquid crystal. The alignment film is formed in later fabrication steps.

Figure 10:
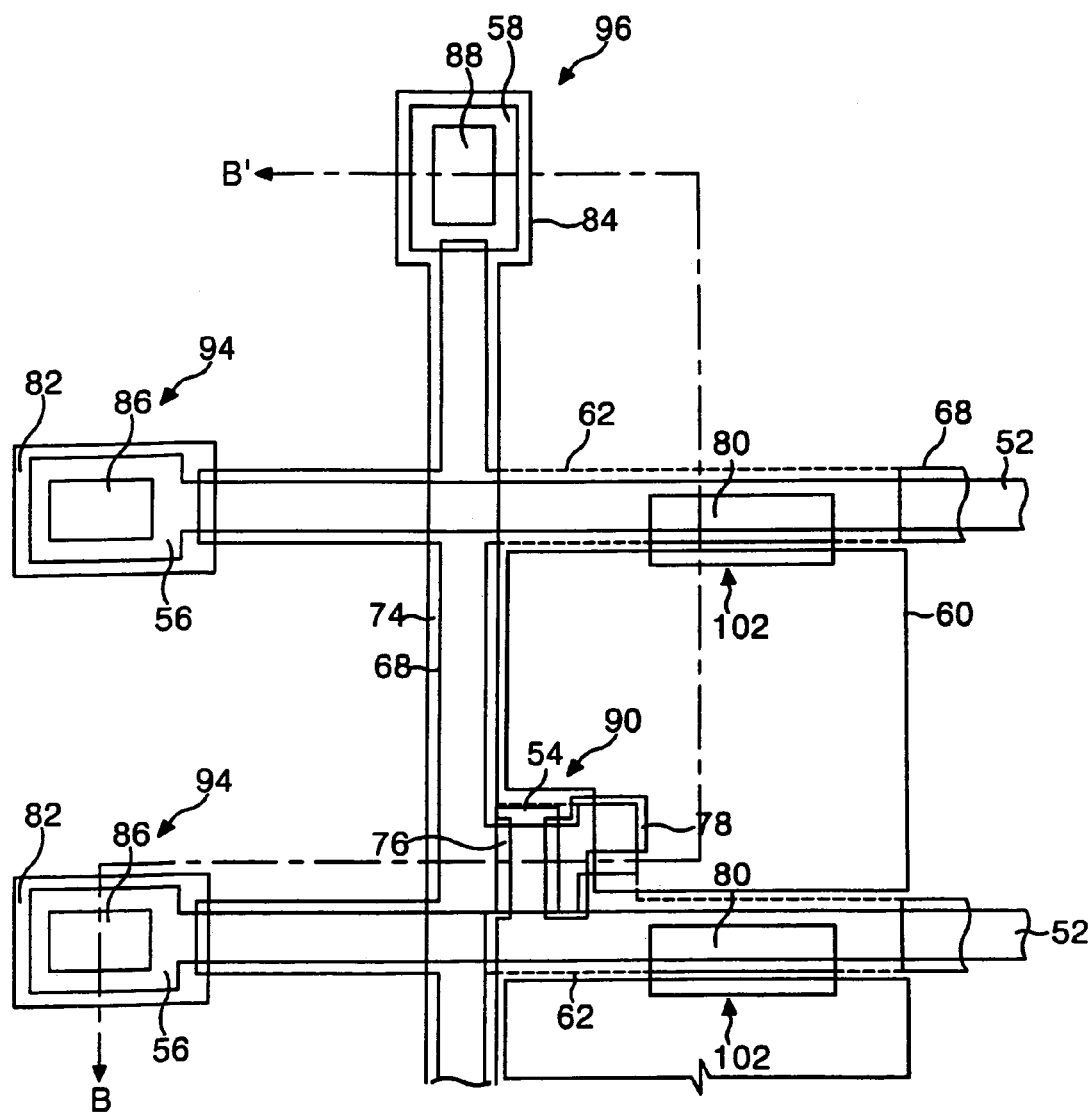
FIG. 10 is a plan view showing a thin film transistor array substrate according to another embodiment of the present invention.
Figure 11:
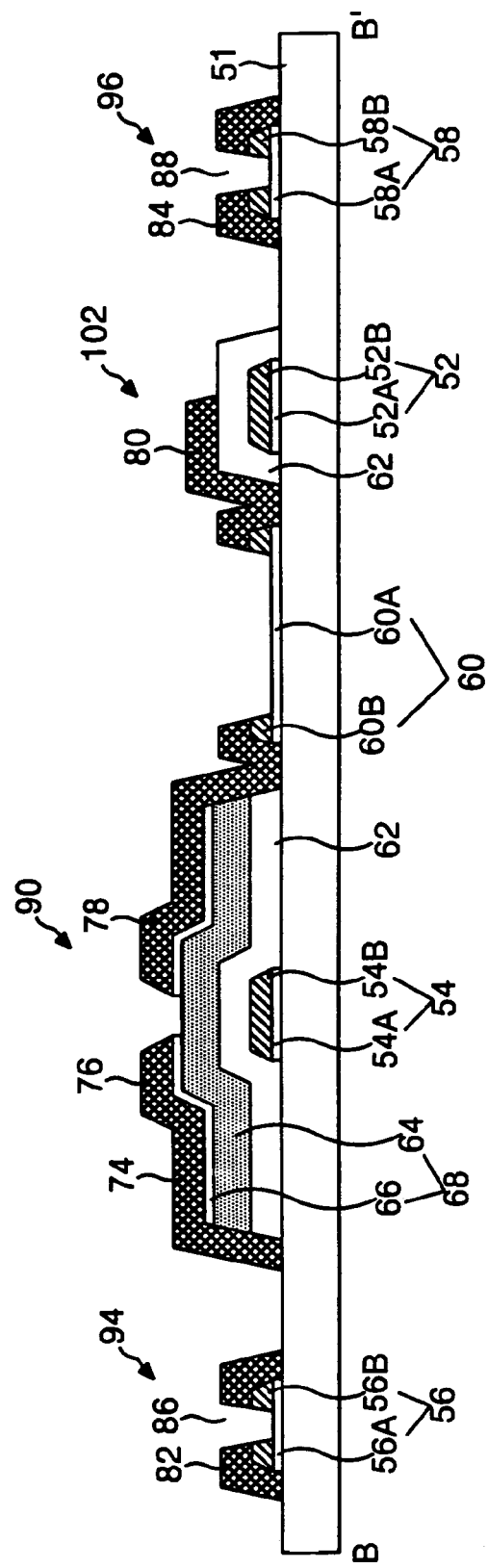
FIG. 11 is a sectional view of the thin film transistor array substrate of FIG. 10 taken along line B–B'.

FIG. 10 is a plan view showing a structure of a thin film transistor array substrate according to another embodiment of the present invention, and FIG. 11 is a sectional view of the thin film transistor array substrate of FIG. 10 taken along line B–B'. Since the thin film transistor array substrate shown in FIG. 10 and FIG. 11 has the same elements as that shown in FIG. 4 and FIG. 5 except for the configuration of a storage capacitor 102, the same elements will be given the same reference numerals and a detailed description about them will be omitted.

The storage capacitor 92 shown in FIG. 4 and FIG. 5 consists of the pre-stage gate line 52, the storage electrode 80, the gate insulating pattern 62, the active layer 64, and the ohmic contact layer 66. On the other hand, the storage capacitor 102 shown in FIG. 10 and FIG. 11 consists of the pre-stage gate line 52, the gate insulating pattern 62, and the storage electrode 80. Both storage capacitors connect to the pixel electrode 60. The storage capacitor 102 shown in FIG. 10 and FIG. 11 lacks the active layer 64 and the ohmic contact layer 66, which have been removed. Removal of the active layer 64 and the ohmic contact layer 66 reduces the gap between the gate line 52 and the storage electrode 80, which beneficially increases the capacitance of the storage capacitor 102.

Removal of the active layer 64 and the ohmic contact layer 66 from the storage capacitor 102 can be performed by using a diffractive exposing area 104 in the second mask process that corresponds to the position of the storage capacitor 102. This is suggested in FIG. 12A and FIG. 12B. The first mask process is identical to the process as mentioned in FIG. 6A and FIG. 6B, and the third mask process is identical to the process as mentioned in FIG. 9A and FIG. 9B.

Figure 12A:
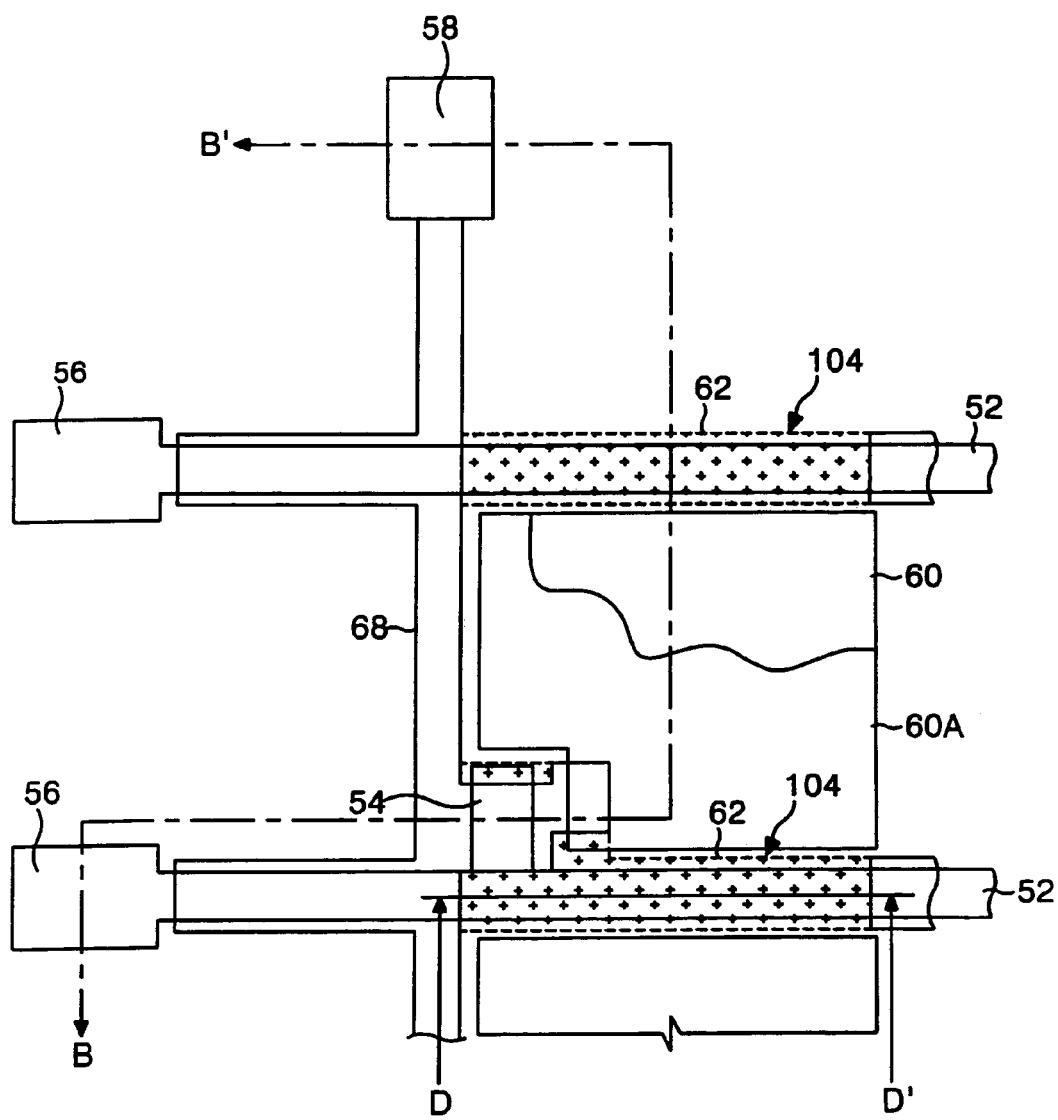
FIG. 12A to FIG. 12C are, respectively, a plan view and a sectional view for explaining a second mask process in the method of manufacturing the thin film transistor array substrate shown in FIG. 10 and FIG. 11.
Figure 12B:
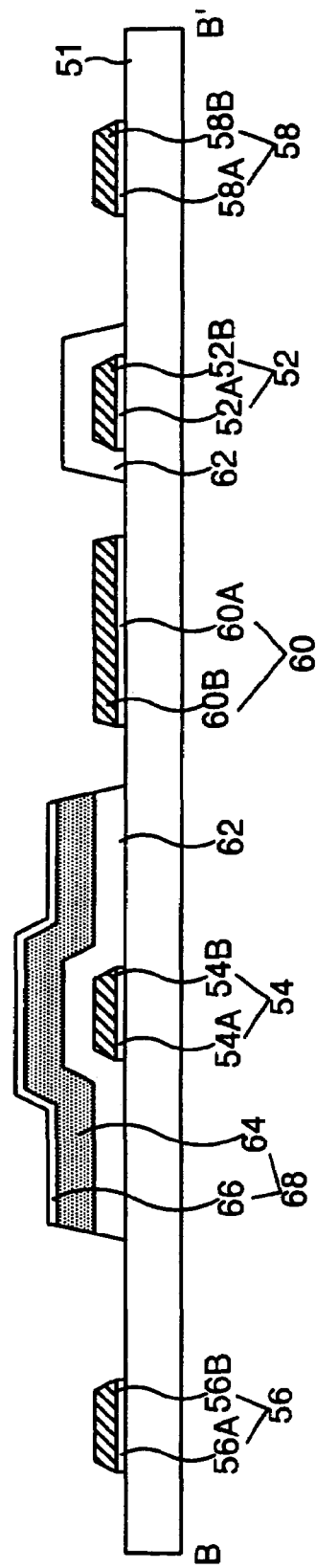

Referring to FIG. 12A and FIG. 12B, the gate insulating pattern 62 and the semiconductor pattern 68 are formed on the lower substrate 52 provided with the gate patterns and the pixel electrode 60 by the first mask process. On the lower substrate 51 after the first mask process is completed, a gate insulating layer, an amorphous silicon layer, and an n+ amorphous silicon layer are sequentially deposited, possibly using plasma enhanced chemical vapor deposition (PECVD) or sputtering. Further, a photo-resist material is coated over those layers. That photo-resist material is then patterned using a second mask to provide a photo-resist pattern. In this case, a diffractive exposure mask having a diffractive exposing part at specific areas. Thus, in the photo-resist pattern, the diffractive exposing part includes a portion of the thin film transistor area and the storage capacitor formation area. Thus, the portion of the photo-resist pattern that corresponds to the diffractive exposing part has a reduced thickness than areas where the semiconductor pattern 68 is to be formed. In other words, in the photo-resist pattern, the shielding area is positioned at an area where all of the semiconductor pattern 68 and the gate insulating pattern 62 should be formed, whereas the diffractive exposing area is positioned at an area 104 where the semiconductor pattern 68 should be removed and the gate insulating pattern 62 only should be left.

Figure 12C:
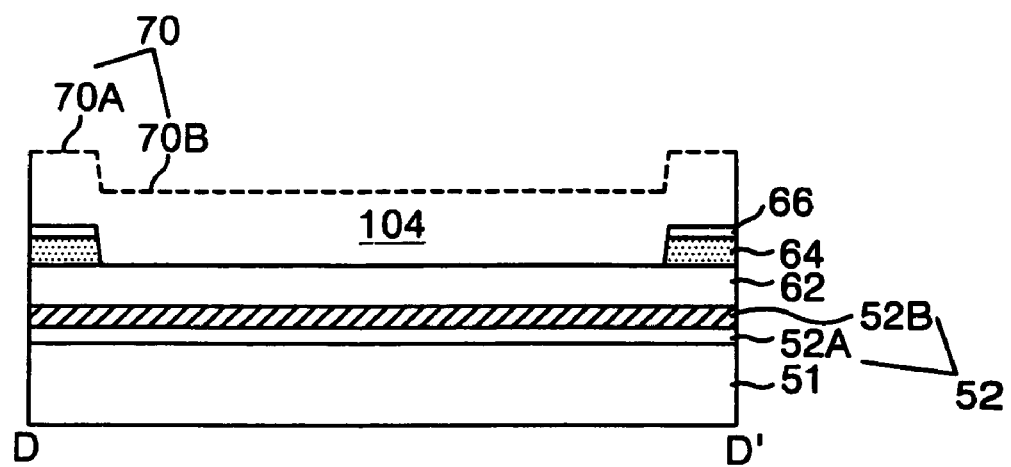

The n+ amorphous silicon layer, the amorphous silicon layer, and the gate insulating layer are then patterned by etching using such the photo-resist pattern as a mask. This provides the gate insulating pattern 62 and the semiconductor pattern 68. Subsequently, the diffractive exposing area of the photo-resist pattern is removed by the ashing process to leave photo-resist only in the shielding areas. Then, the semiconductor pattern 68 is exposed by a dry etching process using the remaining photo-resist pattern as a mask. The area 104 where the semiconductor-pattern 68 is removed includes the remaining areas. Thus, if the semiconductor pattern 68 is exposed in such a state that it does not overlap with the source and drain electrodes, it is activated by a backlight or an external light, thereby preventing generation of light leakage current. Further, as shown in FIG. 12C, the area 104 removed with the semiconductor pattern 68 includes an area where the storage capacitor is to be formed in an overlapped area with the gate line 52. Accordingly, it becomes possible to prevent signal interference between the cells caused by the semiconductor pattern 68 and to enhance the capacitance of the storage capacitor.

As described above, according to the present invention, the three-round mask process makes it possible to simplify the substrate manufacturing processes to reduce manufacturing costs and to improve manufacturing yield. Particularly, the diffractive exposure mask or the semi-transmitting mask are used in the second mask process for providing the gate insulating pattern and the semiconductor pattern (t the same time) and to partially remove the semiconductor pattern so that it becomes possible to reduce light-induced leakage current and signal interference.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of manufacturing a thin film transistor array substrate of a liquid crystal display, comprising the steps of:
    forming a first set of structures on a substrate using a first mask process, wherein the first set of structures includes a gate line, a gate electrode, a gate pad, a data pad, and a pixel electrode, wherein the first set of structures are comprised of a lower transparent conductive pattern and an upper metal pattern;
    forming a gate insulating layer, semiconductive layer, and ohmic contract layer over the first set of structures and over the substrate;
    forming a photo-resist pattern over the ohmic contact layer that is over the gate line and over the ohmic contact layer that is over the gate electrode;
    forming a second set of structures using a second mask process, wherein the second set of structures includes both a gate insulating pattern and a semiconductor pattern over the gate electrode, and a gate insulating pattern and a semiconductor pattern over the gate line, and wherein the second mask process exposes the pixel electrode, the data pad, and the gate pad;
    depositing a metal layer over the substrate, over the pixel electrode, over the data pad, over the gate pad, and over the second set of structures; and
    etching the deposited metal layer using a third mask process to form spaced apart source and drain electrodes, a gate pad contact hole, a data pad contact hole, data lines, and a storage electrode;
    wherein the drain electrode electrically contacts the pixel electrode, wherein the storage electrode electrically contacts the pixel electrode, and wherein the storage electrode is over at least part of the gate line.

2. The method as claimed in claim 1, wherein forming the photo-resist pattern includes forming a first thickness of photo-resist on a first area, and a second thickness of photo-resist on a second area, wherein the second thickness is less than the first thickness.

3. The method as claimed in claim 2, wherein forming the photo-resist pattern includes using a diffractive exposure mask.

4. The method as claimed in claim 2, wherein forming the photo-resist pattern in the second area includes using a semi-transparent mask.

5. The method as claimed in claim 2, wherein forming the photo-resist pattern includes the step of removing the photo-resist pattern from the second area.

6. The method as claimed in claim 5, wherein photo-resist is removed from the second area using an ashing process.

7. The method as claimed in claim 1, wherein etching the deposited metal layer removes the deposited metal layer from the pixel electrode.

8. The method as claimed in claim 1, wherein the step of forming said semiconductor pattern includes removing a semiconductor material from part of the gate line.

9. The method as claimed in claim 8, wherein the step of removing a semiconductor material from part of the gate line includes removing the semiconductor material from between subsequently formed data lines.

10. The method as claimed in claim 8, wherein the step of removing a semiconductor material from part of the gate line includes removing the semiconductor material from an area where a storage electrode is to be formed.

* * * * *